United States Patent [19]
Tsurushima

[11] 3,949,316
[45] Apr. 6, 1976

[54] CASCADE-CONNECTED TRANSISTOR AMPLIFIER

[75] Inventor: Katsuaki Tsurushima, Kawasaki, Japan

[73] Assignee: Sony Corporation, Tokyo, Japan

[22] Filed: Apr. 1, 1975

[21] Appl. No.: 564,118

[30] Foreign Application Priority Data
Apr. 5, 1974  Japan............................ 49-38581

[52] U.S. Cl. ...................... 330/24; 330/19; 330/25; 330/28; 330/35; 330/38 M; 330/107
[51] Int. Cl.² .......................................... H03F 3/16
[58] Field of Search ............. 330/24, 19, 25, 28, 35, 330/38 M, 107

[56] References Cited
OTHER PUBLICATIONS
Burrows, "Ceramic Pickups and Transistor Pre-Amplifiers" *Wireless World*, Feb. 1970, pp. 56–60, 80.

*Primary Examiner*—James B. Mullins
*Attorney, Agent, or Firm*—Lewis H. Eslinger; Alvin Sinderbrand

[57] ABSTRACT
A cascade-connected transistor amplifier comprised of a bipolar transistor having one of its collector and emitter electrodes connected directly to the gate electrode of an FET. The bipolar transistor comprises a first semiconductor region of a first conductivity type, a second semiconductor region of a second conductivity type disposed adjacent the first semiconductor region, a third semiconductor region of the first conductivity type disposed adjacent the second semiconductor region, and a potential barrier positioned within the first semiconductor region spaced from and opposite the junction defined by the first and second semiconductor regions by a distance smaller than the diffusion distance of minority carriers injected into the first semiconductor region, the semiconductor regions being provided with emitter, base and collector electrodes, respectively. The FET has triode-type dynamic characteristics. A first load impedance is connected to one of the collector and emitter electrodes, and a second load impedance is connected in series with the drain-source circuit of the field effect transistor. Operating voltages are supplied to the respective bipolar and field effect transistors through the respective load impedances. An input signal is applied to the base electrode of the bipolar transistor. In one embodiment, an AC negative feedback impedance defines a feedback path between the drain electrode of the field effect transistor and the emitter electrode of the bipolar transistor. The AC feedback circuit can be used to compensate for equalizing of the input signal.

10 Claims, 8 Drawing Figures

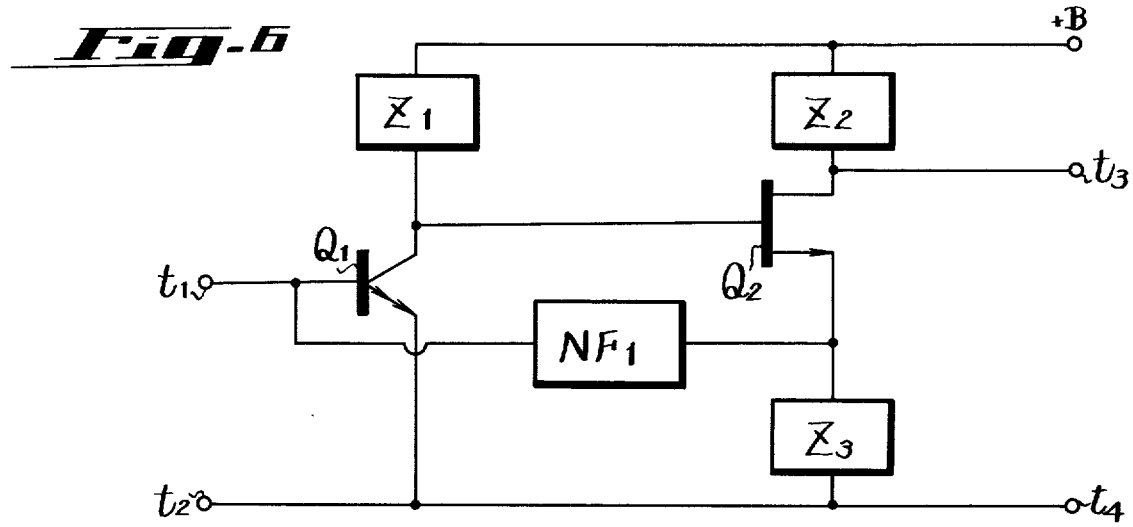
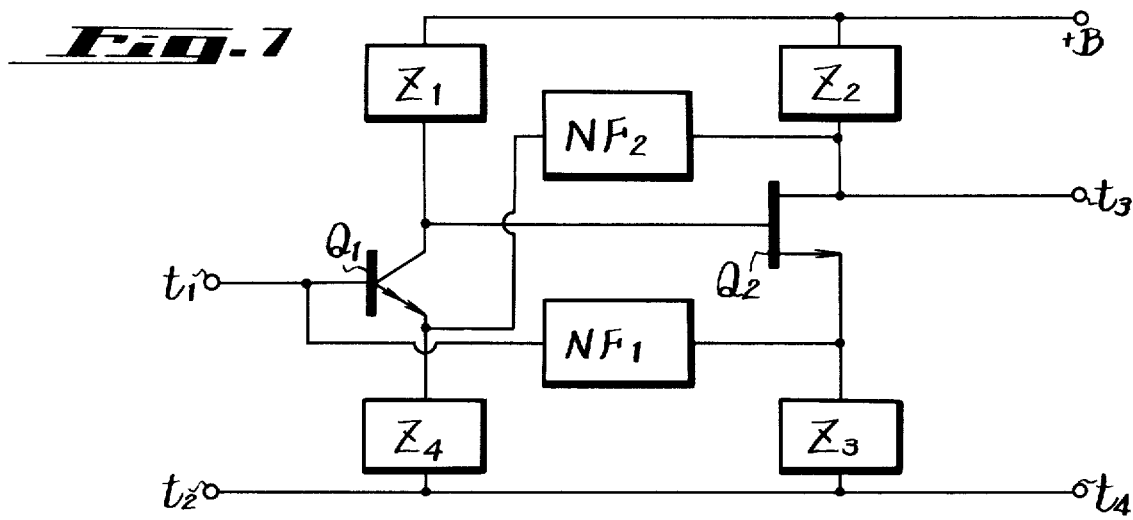
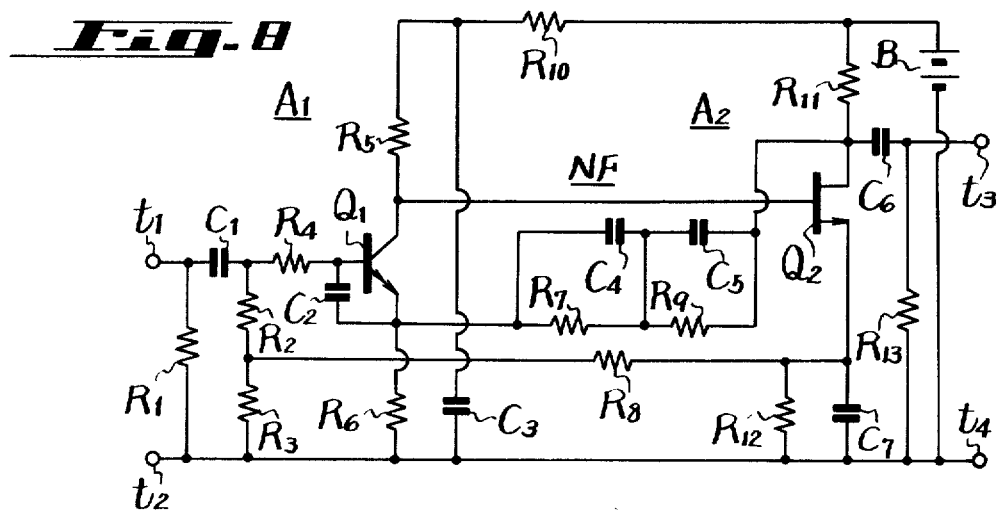

CASCADE-CONNECTED TRANSISTOR AMPLIFIER

BACKGROUND OF THE INVENTION

This invention relates to a cascade-connected transistor amplifier and, more particularly, to a cascade-connected amplifier formed of a specific type of bipolar transistor which is connected in cascade to a field effect transistor (FET) having triode-type dynamic characteristics.

Cascaded amplifiers find ready utilization in diverse applications, especially wherein high gain of an amplified signal is desired. If each cascaded stage provides a signal gain, then the total amplifier gain is a function of the cumulative gains of the respective stages Cascaded amplifiers serve additional functions, and one such function is signal equalization. Equalization is used in various signal processes and usually is provided to modify an initial signal so as to avoid deterioration thereof attributed to the inherent characteristics of a signal processing device. A compensating equalizing operation usually is necessary to restore the signal recovered from the signal processing device to its initial form.

In the field of recording signals on a phonograph record, it is conventional to equalize the input signals prior to recording in accordance with the so-called RIAA equalizing characteristics. These characteristics can be graphically represented as a family of frequency-related curves having two steps therein. Of course, if the recorded signal is equalized, it is preferable to compensate for such equalization when the recorded signal is reproduced from the phonograph record. This equalization can be accomplished by an equalizer amplifier formed of two or more stages of bipolar transistors. It is necessary for such an equalizer amplifier to have a high signal-to-noise ratio (S/N), to have a high signal gain and to provide minimal signal distortion. It is believed that an appropriate bipolar transistor for satisfying all of these prerequisites so as to be effectively used in an equalizer amplifier has not, heretofore, been developed.

Furthermore, when an equalizer amplifier must compensate for prior equalization in accordance with the RIAA characteristics, it is proposed to use an AC negative feedback circuit to provide such equalization compensation. However, such compensation must be provided over a relatively wide input signal frequency range and up to relatively high frequency signals. This would result in a low output impedance for such AC feedback circuit. Such a low output impedance would have an undesired effect upon the equalizer amplifier. Unfortunately, if the output impedance of the feedback circuit is high, the necessary compensation for the higher frequency signals cannot be attained.

OBJECTS OF THE INVENTION

Therefore, it is an object of the present invention to provide an improved cascade-connected transistor amplifier.

Another object of this invention is to provide a cascade-connected amplifier wherein the aforenoted defects are overcome.

Still another object of this invention is to provide a cascade-connected amplifier which is formed of a particular type of bipolar transistor having low noise and high current amplification factor, in combination with a field effect transistor having triode-type dynamic characteristics.

It is a further object of this invention to provide an improved cascade-connected amplifier formed of a newly developed bipolar transistor and a field effect transistor having triode-type dynamic characteristics and including a DC negative feedback circuit to provide stable operation of the cascaded amplifier notwithstanding temperature drift.

An additional object of this invention is to provide an improved cascade-connected transistor amplifier formed of a newly developed bipolar transistor and a field effect transistor having triode-type dynamic characteristics and including an AC negative feedback circuit between the cascaded transistor devices.

A still further object of this invention is to provide a cascade-connected transistor amplifier having an AC feedback circuit whereby the amplifier is readily adapted for use as an equalizer amplifier.

Yet another object of this invention is to provide a cascaded amplifier for compensating, or equalizing, an input signal which had been equalized in accordance with RIAA characteristics.

Various other objects and advantages of this invention will become apparent from the forthcoming detailed description and the novel features will be particularly pointed out in the appended claims.

SUMMARY OF THE INVENTION

In accordance with this invention, a cascade-connected transistor amplifier is provided comprised of a bipolar transistor which includes a first semiconductor region of a first conductivity type, a second semiconductor region of a second conductivity type disposed adjacent the first semiconductor region, a third semiconductor region of the first conductivity type disposed adjacent the second semiconductor region, and a potential barrier positioned within the first semiconductor region spaced from and opposite the junction defined by the first and second semiconductor regions and being spaced from the junction by a distance smaller than the diffusion distance of minority carriers injected into the first semiconductor region, the semiconductor regions being provided with emitter, base and collector electrodes; a field effect transistor having triode-type dynamic characteristics, the gate electrode of the field effect transistor being connected directly to one of the collector and emitter electrodes of the bipolar transistor; a first load impedance connected to one of the collector and emitter electrodes; a second load impedance connected in series with the drain-source circuit of the field effect transistor; a source of operating potential to supply operating voltages through the respective load impedances to the bipolar and field effect transistors; and an input circuit for supplying an input signal to the base electrode of the bipolar transistor. In one embodiment thereof, a DC feedback circuit is provided between the respective transistors to stabilize the amplifier operation. In another embodiment, an AC feedback circuit is provided to compensate for equalization of the input signals.

BRIEF DESCRIPTION OF THE DRAWINGS

The following detailed description of certain preferred embodiments will best be understood in conjunction with the accompanying drawings in which:

FIG. 6 is a circuit diagram in partial schematic, partial block form showing one embodiment of a cascaded amplifier in accordance with this invention;

FIG. 7 is a circuit diagram in partial schematic, partial block form showing another embodiment of the cascaded amplifier in accordance with the present invention; and FIG. 8 is a schematic diagram showing a particular embodiment of the cascaded amplifier in accordance with this invention which can be used as an equalizing amplifier.

DETAILED DESCRIPTION OF CERTAIN ONES OF THE PREFERRED EMBODIMENTS

Figure 1:
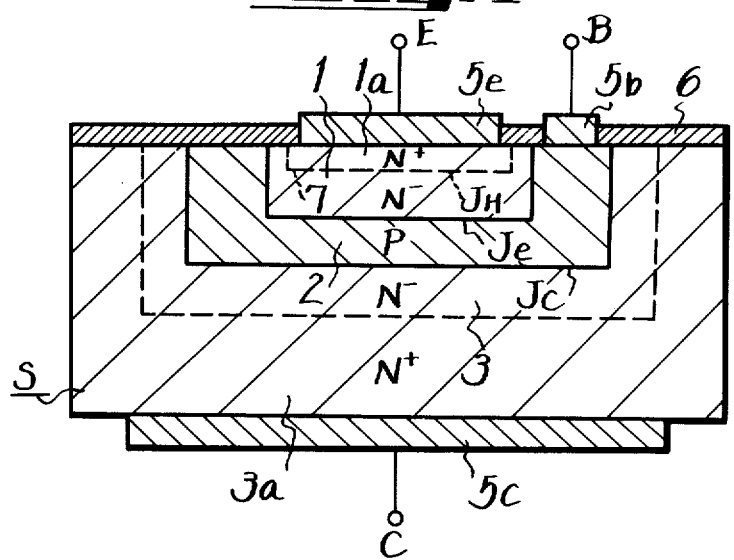
FIG. 1 is a sectional view showing one example of the bipolar transistor which is used in the cascaded amplifier of this invention.

A newly developed bipolar transistor is advantageously used with the present invention. To best understand the improved results attained by this invention, a comparison between such a bipolar transistor and a typical prior art transistor will be explained.

One characteristic which generally is used to evaluate a bipolar transistor is the grounded emitter current amplification factor $h_{FE}$. This current amplification factor may be expressed in terms of the grounded base current amplification factor $\alpha$ as:

$$h_{FE} = \frac{\alpha}{1-\alpha} \quad (1)$$

The value of $\alpha$ is established as:

$$\alpha = \alpha^* \beta \gamma \quad (2)$$

where $\alpha^*$ is the collector amplification factor, $\beta$ is the base transmission efficiency and $\gamma$ is the emitter injection efficiency.

When the emitter injection efficiency $\gamma$ of an NPN-type transistor is considered, it may be expressed as follows:

$$\gamma = \frac{Jn}{Jn + Jp} = \frac{1}{1 + \frac{Jp}{Jn}} \quad (3)$$

where $Jn$ is the current density of electrons injected from the emitter region to the base region, and $Jp$ is the current density of holes injected from the base to the emitter. $Jn$ and $Jp$, in turn, may be respectively expressed as follows:

$$Jn = \frac{qDn\, n_p}{Ln} \left[ \exp\left(\frac{qV}{kT}\right) - 1 \right] \quad (4)$$

$$Jp = \frac{qDp\, p_n}{Lp} \left[ \exp\left(\frac{qV}{kT}\right) - 1 \right] \quad (5)$$

Therefore, the following relationship is obtained.

$$\delta = \frac{Jp}{Jn} = \frac{Ln}{Lp} \cdot \frac{Dp}{Dn} \cdot \frac{p_n}{n_p} \quad (6)$$

where $T$: temperature,
$Ln$: diffusion length of the minority carriers in the base,
$Lp$: diffusion length of the minority carriers in the emitter,
$Dn$: diffusion constant of the minority carriers in the base,
$Dp$: diffusion constant of the minority carriers in the emitter,
$n_p$: minority carrier density in the base at the balanced state,
$p_n$: minority carrier density in the emitter at the balanced state, and
$V$: voltage applied to the emitter junction.

If the impurity concentration of the emitter is represented as $N_D$ and the impurity concentration of the base is represented as $N_A$, then $p_n/n_p$ can be replaced by $N_A/N_D$ and $Ln$ is consequently limited by the base width $W$ to be $Ln=W$, so that the following relation is established:

$$\delta = \frac{W}{Lp} \cdot \frac{Dp}{Dn} \cdot \frac{N_A}{N_D} \quad (7)$$

The diffusion constant $D$ is a function of carrier mobility and temperature, and can be regarded as being substantially constant.

As is apparent from the above equations, the value of $\delta$ preferably should be small in order to enhance the value of $h_{FE}$ of the transistor. Therefore, in the typical prior art bipolar transistor, the emitter impurity concentration $N_D$ is normally made sufficiently large in order to reduce the value of $\delta$.

However, if the emitter impurity concentration is increased to a relatively large value, for example, more than about $10^{19}$ atoms/cm$^3$, lattice defects occur, dislocation or the like results and, consequently, a perfect crystal cannot be attained. Further, because of the high emitter impurity concentration itself, the life time $\tau_p$ of the minority carriers injected therein from the base is decreased. As a result, the diffusion length $L_p$ of the minority carriers (holes) is reduced in accordance with the following equation:

$$L_p = \sqrt{D_p \cdot \tau p} \quad (8)$$

Therefore, it is apparent that the value of $\delta$ cannot be practicably reduced to its desirably small value, and hence the injection efficiency $\gamma$ cannot be enhanced beyond a limited amount.

In accordance with preferred embodiments of a bipolar transistor which can be used with the present invention, the aforenoted defects attending prior art transistors are avoided, yet the amplification factor $h_{FE}$ is very high in comparison with that of the usual prior art bipolar transistor. Also, the base-emitter breakdown voltage with opened collector $BV_{BEO}$ is high. Furthermore, the various operating characteristics for the preferred embodiments of the bipolar transistor when the transistor is biased for either forward or reverse operation are symmetrical. For example, the collector-base and emitter-base characteristics of the transistor are symmetrical forward and reverse biasing thereof. Additionally, the preferred embodiments of the bipolar transistor exhibit desirable saturation characteristics so that a large input signal can be adequately amplified with fidelity.

The aforenoted features are found in the improved bipolar transistor which is schematically depicted in FIG. 1. The transistor is a low emitter concentration (LEC) transistor. In the illustrated embodiments, an NPN transistor is shown; however, it should be readily understood that the following description is equally applicable to a PNP bipolar transistor. Successive adjacent layers of semiconductor material of opposite type conductivity are provided in a substrate S so as to form, in order, a first, or emitter, region 1 of a first conductivity type, such as N-type, with high resistivity, a second, or base, region 2 of second conductivity type, or P-type, with high resistivity, and a third, or collector, region 3 of the first conductivity type, or N-type, with high resistivity. The first, second and third regions, i.e., the emitter, base and collector regions, are disposed adjacent to each other. As shown, the emitter region may be surrounded by the base region which, in turn, is surrounded by the collector region. Alternatively, the respective regions may be suitably stacked so that one adjacent region does not surround another. In the alternative embodiment, the stacked regions would extend to an exposed surface of the structure so that suitable electrodes can be connected thereto.

A first PN junction, or emitter junction, $Je$ is formed between the first and second, or emitter and base, semiconductor regions 1 and 2. A second PN junction, or collector junction, $Jc$ is formed between the second and third, or base and collector, semiconductor regions 2 and 3. The semiconductor region 1 has a potential barrier 7 formed therein which is positioned opposite the junction $Je$ and is spaced therefrom by a distance which is smaller than the diffusion distance $Lp$ of minority carriers (such as holes) which are injected into the region 1 from the region 2. The energy level of the potential barrier 7 is greater than the energy of the injected minority carriers and is at least as great as heat energy which may be represented as $kT$, wherein $k$ is the Boltzmann constant and $T$ temperature. The potential barrier is formed by providing a region $1a$ of high impurity concentration but of the same conductivity type in the region 1. The addition of the high impurity concentration region $1a$ forms an L–H junction $J_H$ in the region 1. It should be appreciated that the potential barrier 7 forms a transition region across, for example, the junction $J_H$ which may be considered as having a given width.

As shown in FIG. 1, respective electrodes, i.e., emitter, base and collector electrodes $5e$, $5b$ and $5c$ are deposited on the high impurity concentration region $1a$ which is within the emitter region 1, on the base region 2 and on the collector region 3, respectively. These electrodes are in ohmic contact with the corresponding regions and respective terminals are derived therefrom so as to form emitter, base and collector terminals E, B and C, respectively.

That portion of the region 1 which is not provided with the high impurity concentration has a relatively low impurity concentration, on the order of $10^{15}$ atoms/cm$^3$. The impurity concetration of the region 2 is somewhat higher, on the order of about $10^{15}$ to $10^{17}$ atoms/cm$^3$. The region 3 has an impurity concentration which is relatively low and is similar to the low impurity concentration described for the region 1, on the order of $10^{15}$ atoms/cm$^3$. Since the impurity concentration in the regions 1, 2 and 3 at the portions in the vicinity of the junctions $Je$ and $Jc$ are low, and since the crystalline property of the respective regions is excellent, the diffusion distance $L_p$ of the minority carriers injected into the region 1 becomes high.

A portion of the substrate S is provided with a low resistance region $3a$ having a high impurity concentration. This region $3a$ is opposite to and spaced away from the junction $Jc$. Also, an insulating layer 6, such as silicon dioxide ($SiO_2$) is formed on the upper surface of the substrate S and across the surface of the illustrated structure.

If the bipolar transistor illustrated in FIG. 1 is provided with suitable voltages at the respective emitter, base and collector terminals so that the emitter junction $Je$ is forward biased and the collector junction $Jc$ is reverse biased, transistor operation is attained and the holes injected from the region 2, i.e., the base region, into the region 1, i.e., the emitter region, have a long lifetime and, moreover, are provided with a long diffusion distance $L_p$. As a result thereof, the emitter injection efficiency $\gamma$ can be high. However, regardless of the actual diffusion length $L_p$, if the injected holes reach the substrate surface to result in surface recombination thereat, the effective diffusion length $L_p$ is significantly shortened. But, in accordance with the structure shown in FIG. 1, the potential barrier 7, which is spaced from the junction $Je$ by a distance which is shorter than the diffusion length, decreases surface recombination so that the effective diffusion length $L_p$ can be considered to be relatively long. Accordingly, the current component $Jp$ of injected holes from the region 2 into the region 1 is decreased. That is, the differences of the quasi-Fermi levels between these regions, or the inherent built-in voltage at the L–H junction $J_H$, serves to oppose the minority carrier diffusion. Consequently, when the potential barrier 7 is of a sufficiently high energy level, the diffusion current due to the concentration gradient of holes at the L–H junction $J_H$ and the drift current due to the built-in voltage cancel each other to thereby reduce the minority carrier current $J_p$ injected from the base region through the low impurity concentration emitter region. Therefore, the current component formed of electrons passing through the emitter junction $Je$ to the collector region is increased to thereby increase the emitter injection efficiency $\gamma$ so as to enhance the amplification factor $h_{FE}$.

The height of the potential barrier, that is, the difference in the energy level thereacross, must be higher than the energy of the injected holes and at least as great as the aforenoted heat energy. Desirably, the height of the potential barrier should be higher than 0.1 eV. Another factor which determines the height of the potential barrier is that the hole diffusion length must not terminate within the transition region established by the potential barrier. That is, the diffusion length $L_p$ must be longer than the width of this transition region. Accordingly, a potential barrier of 0.2 eV is satisfactory and can be formed by the judicious selection of the amount of impurities in the high impurity concentration region 1a and its gradient.

Figure 2:
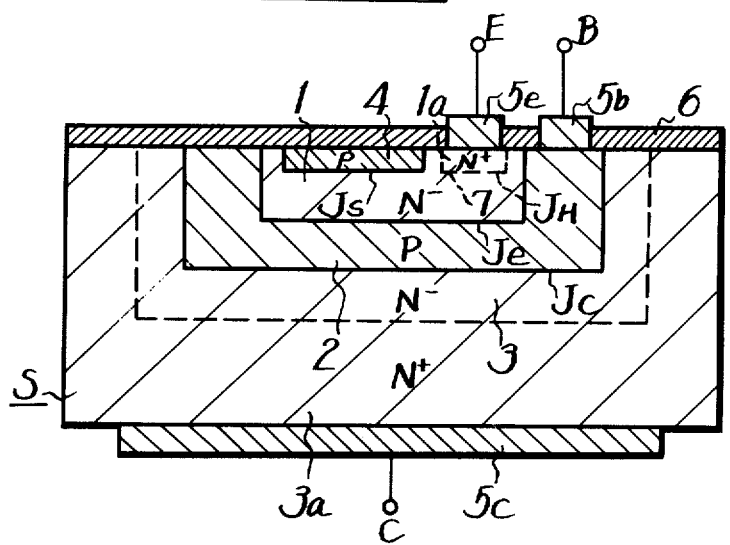
FIG. 2 is a sectional view showing another example of the bipolar transistor which is used in the cascaded amplifier of this invention.

Another embodiment of a bipolar transistor which may be used with this invention is depicted in FIG. 2 wherein like component parts are identified by like reference numerals. It is seen that the FIG. 2 embodiment differs from the FIG. 1 embodiment in that the region 1, in addition to having the high impurity concentration region 1a therein also is provided with a P-type region 4 which, like the region 1a, forms a junction $J_S$ which is opposite to and spaced from the emitter junction $Je$. The junction $J_S$ is a PN junction and is not contiguous with the L–H junction $J_H$. The distance between the PN junction $J_S$ and the emitter junction $Je$ is less than the diffusion length $L_p$ of minority carriers which are injected into the region 1. This, it is recalled, is similar to the separation between the potential barrier 7 and the emitter junction $Je$. Hence, holes which are injected into the region 1 will reach the P-type region 4 because of the longer diffusion length $L_p$ and will be absorbed into the P-type region. The region 4 may be considered to be electrically isolated so that its potential is increased as a function of the absorption of holes, resulting in the forward biasing of the PN junction $J_S$. Consequently, holes are re-injected into the region 1 from the region 4. The concentration of holes in the region 1 adjacent the P-type region 4 thus is increased. Accordingly, the concentration distribution of holes in the region 1 between the junctions $Je$ and $J_S$ is uniform to establish a gentle gradient which decreases the flow of diffusion current $J_p$ from the region 2 into the region 1.

FIG. 2 shows that the region 4, although of the same conductivity type as the region 2, nevertheless is provided separately therefrom. However, in some embodiments of the bipolar transistor the region 4 may be constructed continuously from the region 2.

Since the regions 1 and 3 have approximately the same low inpurity concentration, it is appreciated that the preferred embodiments of the bipolar transistor are of symmetrical construction with respect to the region 2. Because of this, the illustrated bipolar transistor can be operated as either a forward transistor wherein the regions 1, 2 and 3 are operated as emitter, base and collector regions, respectively, or as a backward transistor wherein the regions 1, 2 and 3 are operated as collector, base and emitter regions, respectively. Thus, both the construction and electrical characteristics of the bipolar transistor are symmetrical.

To assure that the amplification factor $h_{FE}$ for the backward operating transistor is substantially equal to $h_{FE}$ for the forward operating transistor, the high impurity concentration region 3a is extended to the outer, or peripheral, surface of the substrate S to thereby avoid surface recombination thereat. Accordingly, the distance between the region 3a and the second region 2 should be less than the diffusion length of the minority carriers which are injected into the region 3 and the height of the potential barrier formed by the region 3a must be higher than the energy of the injected minority carriers.

The aforedescribed preferred embodiments of the bipolar transistor which can be advantageously used in the present invention are accompanied by several advantages, such as the current amplification factor $h_{FE}$ can be made very high, and, for example, can exceed 3,000. Also, whereas in the typical prior art bipolar transistor the emitter efficiency is enhanced by increasing the impurity concentration $N_D$ of the emitter region, so that the emitter efficiency is dependent upon the concentration difference across the junction between the emitter and base regions, whereby the establishment of the impurity concentrations of both regions must be determined relative to each other, the emitter efficiency of the LEC transistor of FIGS. 1 and 2 is enhanced by the potential barrier which is formed in the region 1 opposite to the junction $Je$ to suppress the current component of the minority carriers injected into the region 1. As a result, the impurity concentration of the regions 1 and 2 have less affect upon each other, and the region 1 can be selected to have a relatively low concentration. In addition, the width of the region 2 and the concentration distribution therein can be as desired with little scattering therein so that the scattering of the amplification factor $h_{FE}$ can be reduced.

As a further advantage, the amplification factor $h_{FE}$ is high even in the case of small currents because the influence of surface recombination is avoided. Moreover, noise is decreased. That is, the main portions of the junctions $Je$ and $Jc$ are respectively formed in those portions of the P-type and N-type regions having low impurity concentration, so that the crystal defect is small. Further, the impurity concentration of, for example, the base electrode 5b of the region 2 may be increased to thereby reduce lateral current along the substrate surface between the emitter and base current so as to correspondingly reduce flicker, or $1/f$ noise. Burst noise as well as the flicker noise also are decreased due to high $h_{FE}$. In addition, base spreading resistance $\gamma bb$ becomes small so that noise is reduced even in the case of a low impedance signal source.

Still further advantages include good temperature characteristics of the amplification factor $h_{FE}$. Also, characteristics with respect to a bi-directional (forward and backward) transistor are symmetrical. Moreover, since the impurity concentrations near the junctions $Je$ and $Jc$ are low, the opened-collector base-emitter breakdown voltage $BV_{BEO}$ is high in both directions of the bi-directional transistor. Also, where the bipolar transistor is used as a power transistor, emission from the emitter is made uniform because of the distributed resistance therein so that the breakdown strength is high. Additionally, the saturation characteristics are good; and when the additional region 4 is provided, the equivalent resistance of the base becomes small.

Figure 3:
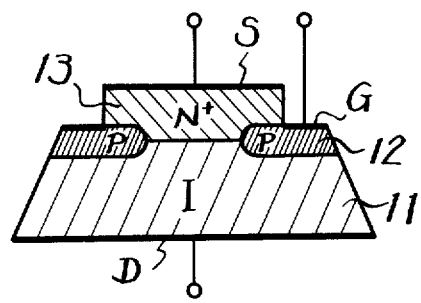
FIG. 3 is a sectional view showing one example of an FET having triode-type dynamic characteristics which can be used in the cascaded amplifier of the present invention.

Turning now to FIG. 3, there is depicted a sectional view of one example of an FET having triode-type dynamic characteristics which may be used in the transistor amplifier in accordance with this invention. The FET is a vertical junction structure formed of an intrinsic semiconductor region 11 having low impurity concentration and high resistance, a P-type semiconductor region 12 having an annular configuration and formed on the upper portion of the intrinsic region 11, annd an N-type semiconductor region 13 having high impurity concentration formed over both the annular P-type region 12 and the intrinsic region 11, as shown. Respective drain (D), gate (G) and source (S) electrodes are provided at the lower surface of the intrinsic region 11, an exposed portion of the P-type annular region 12 and the upper surface of the N-type region 13, respectively.

Figure 4:
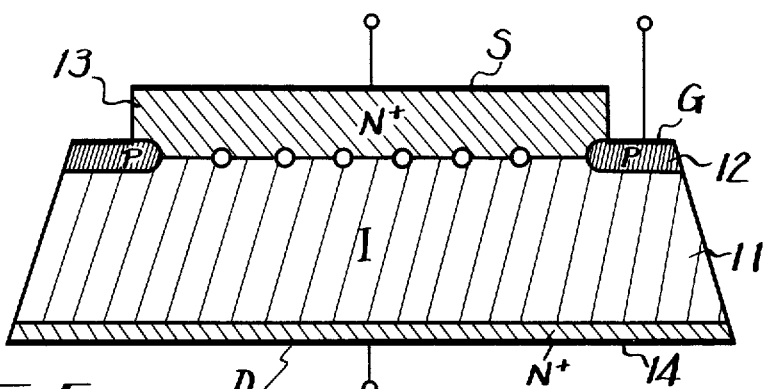
FIG. 4 is a sectional view showing another example of an FET having triode-type dynamic characteristics which can be used in the cascaded amplifier of the present invention.

The vertical junction FET depicted in FIG. 3 exhibits triode-type dynamic characteristics. A preferred embodiment of such an FET is depicted in FIG. 4 wherein like reference numerals identify corresponding elements. The FIG. 4 embodiment may be thought of as being formed by a combination of plural FET's of the type shown in FIG. 3 and closely resembles the aforedescribed FIG. 3 embodiment of the FET with the added modifications that the P-type annular region 12 is formed with a mesh-type structure therewithin, as shown. Accordingly, the high impurity concentration N-type region 13 is seen to overlie both the annular and mesh-shape P-type region 12 and the intrinsic region 11, the mesh-shape defining a boundary between the intrinsic region and the overlying high impurity concentration N-type region. Furthermore, an additional N-type semiconductor region 14 having high impurity concentration is formed on the lower surface of the intrinsic semiconductor region 11, and the drain electrode D is formed thereon.

The equivalent internal resistance Rc between the source and drain electrodes is a composite resistance comprised of the resistance between the source electrode and the channel within the FET, the resistance of the channel itself and the resistance between the channel and the drain electrode. In the prior art junction FET the source-to-channel resistance is high, the channel resistance is high because of its narrow and long configuration and the channel-to-drain resistance also is high. Consequently, it is appreciated that the resistance Rc in the prior art junction FET is very high. As a result of this high resistance, the prior art junction FET exhibits pentode-type dynamic characteristics and, as is apparent therefrom, the drain current becomes saturated as the drain voltage is increased.

In comparison to the aforedescribed prior art junction FET, the FET shown in FIG. 4 is characterized by a relatively small separation between the source electrode S and a channel formed in the P-type region 12 and, additionally, the channel length itself is relatively small. Also, the FET depicted in FIG. 4 is characterized by short vertical channels, whereas the prior art FET exhibits long lateral channels. Consequently, the resistance Rc of the vertical junction FET depicted in FIG. 4 is much smaller than the resistance Rc of the prior art FET. As a numerical comparison, the minimum equivalent resistance, that is, output resistance, of a prior art FET is on the order of several hundred ohms whereas the equivalent resistance of the FET illustrated in FIG. 4 is on the order of several ten ohms. Furthermore, the drain current of the illustrated FET does not become saturated as the drain voltage increases. The voltage-current characteristics with respect to the drain electrode thus exhibit superior linearity over those of the prior art, thereby permitting effective use of the FET in an amplifier with high signal fidelity.

Figure 5:
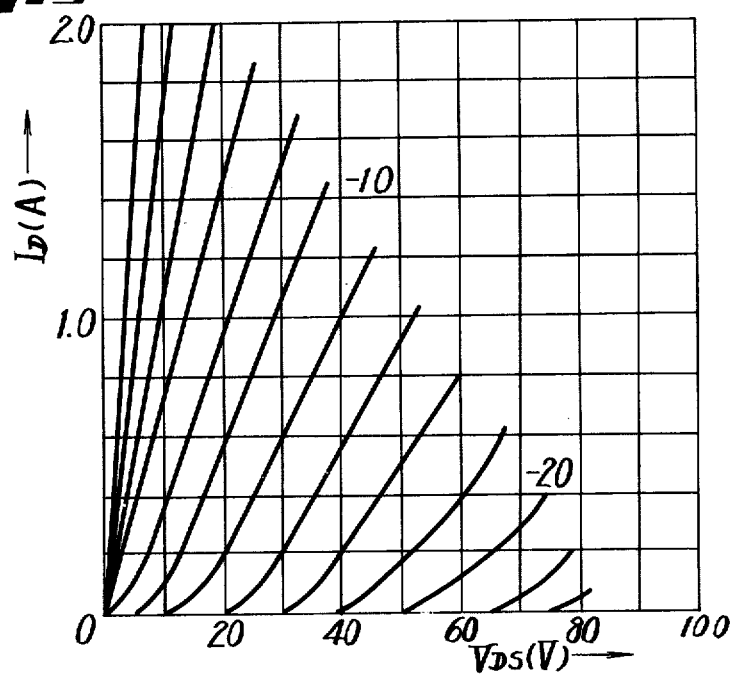
FIG. 5 is a graphical representation of the dynamic characteristic of the FET which can be used in the cascaded amplifier of this invention.

An illustration of the dynamic characteristics exhibited by the FET shown in FIG. 4 is graphically represented in FIG. 5. This graphical representation depicts the relationship between the drain current $I_d$, in milliamps, and the drain voltage $V_d$ in volts. Each individual curve represents the current-voltage relationship for corresponding gate voltages $V_g$ wherein the gate voltage is the variable parameter from, for example, 0V to −24V. It is recognized that the characteristic curves shown in FIG. 5 are analogous to the curves which represent the dynamic characteristics of a conventional triode. Therefore, because the FET is of the type which exhibits triode-type dynamic characteristics, the resistance Rc is substantially constant, even in the environment of voltage variations, and the FET is capable of producing a large output signal having little distortion.

Referring now to the block diagram of FIG. 6 showing one embodiment of a cascaded amplifier in accordance with the teachings of the present invention, a first stage includes an LEC transistor of the type described hereinabove and is connected in cascade to a second stage which includes an FET having triode-type dynamic characteristics. As shown, the LEC transistor $Q_1$ is connected in grounded-emitter configuration and the collector electrode thereof is directly connected to the gate electrode of the FET $Q_2$, the FET being connected in grounded-source configuration. A collector load $Z_1$ is coupled to the LEC transistor $Q_1$ and a drain load $Z_2$ is coupled to the FET $Q_2$. Furthermore, a DC negative feedback circuit $NF_1$ is provided in a feedback path between the FET source and the LEC transistor base. Finally, a source load $Z_3$ is connected to the FET. Input terminals, or ports, $t_1$ and $t_2$ are provided between the base and emitter electrodes of the LEC transistor $Q_1$; and output terminals, or ports, $t_3$ and $t_4$ are provided between the drain electrode of the FET $Q_2$ and the source load $Z_3$. A DC voltage source +B is connected to supply a DC voltage to the loads $Z_1$ and $Z_2$ and thus to the cascaded amplifier.

In operation, an input signal supplied across the input terminals $t_1$ and $t_2$ is amplified by the LEC transistor $Q_1$ to produce an amplified output at its collector electrode. In this case, the gain of the LEC transistor $Q_1$ may be, for example, 60dB to produce an output having high S/N because of the high $h_{FE}$ (e.g., more than 3000) and the low noise characteristics. The load $Z_1$ contributes to the transistor gain, whereby the larger the load impedance, the higher the gain. An important feature of this invention resides in the high input impendance characteristics of the FET $Q_2$, which permits the value of the load impedance $Z_1$ to be established sufficiently large. Consequently, it is possible to obtain a very high gain, beyond that heretofore attainable.

The collector output of the LEC transistor $Q_1$ is voltage-amplified by the FET $Q_2$ to produce an amplified output across the output terminals $t_3$ and $t_4$. Because of its very low output resistance, the FET $Q_2$ can easily drive a following stage. Also, a suitable gain, for example, 20dB, is derived as a result of the voltage amplification factor of the FET. Acccrdingly, the total gain of the cascade-connected amplifier shown in FIG. 6 can be about 80dB; and this amplifier is seen to be provided with high gain and high S/N.

The DC negative feedback circuit $NF_1$ feeds back a negative voltage to be applied as DC bias to the base electrode of the LEC transistor Q. This feedback contributes to the stabilization of the DC operating points of the respective stages.

The DC bias applied to the FET gate electrode may establish class-A operation so that the gate voltage is less than the source voltage by an amount corresponding to the pinch-off voltage Vp. In other words, since the class-A operation can be effected even with a sufficiently low gate voltage, the load $Z_1$ of the LEC transistor $Q_1$ can be made that much higher, which advantageously improves the gain of the first stage.

FIG. 7 shows another embodiment of the cascade-connected transistor amplifier in accordance with the teachings of this invention in which an AC negative feedback circuit $NF_2$ is further added to the amplifier aforedescribed with respect to FIG. 6. This AC feedback circuit is provided to obtain equalizer characteristics for those applications wherein the cascaded amplifier is used for the reproduction of sound derived from a phonograph record, for example. The AC negative feedback circuit $NF_2$ is connected between the drain electrode of the FET $Q_2$ and the emitter electrode of the LEC transistor $Q_1$. As shown, the LEC transistor is also provided with an emitter impedance $Z_4$.

Even if the AC negative feedback circuit $NF_2$ is constructed with high impedance elements, a stable feedback operation can be effected because of the low output resistance of the FET. Accordingly, the cascade-connected amplifier is quite suitable for use in an amplifier for compensating the RIAA equalizing characteristics attending the output reproduced from a phonograph record.

A description will next be given of one example of a particular circuit according to this invention with reference to the schematic illustration of FIG. 8. This example is used as an equalizing amplifier circuit for equalizing the cartridge output of a phonograph record player. As is known, sound is recorded on a phonograph disc by a recording amplifier having equalizing characteristics. Such characteristics conform to the so-called RIAA equalizing curves. It is desirable to compensate for the recording equalization during reproduction. Accordingly, the output from the phonograph pick-up cartridge should be equalized, as by amplification by an amplifier having compensating RIAA reproducer equalizing curves. Such an amplifier is shown in FIG. 8 and is composed of a first amplifier circuit $A_1$ and a second amplifier circuit $A_2$. The first amplifier circuit $A_1$ is of the grounded-emitter type having input terminals $t_1$ and $t_2$ across which is supplied a phonograph pick-up cartridge output. The input terminal $t_1$ is connected through a series connection of a capacitor $C_1$ and a resistor $R_4$ to the base electrode of the LEC transistor $Q_1$. A resistor $R_1$ is connected as an input impedance across the input terminals $t_1$ and $t_2$. A series connecton of resistors $R_2$ and $R_3$ is connected between the junction defined by the capacitor $C_1$ and the resistor $R_4$ and the input terminal $t_2$. A capacitor $C_2$ is connected between the base and emitter electrodes of the transistor $Q_1$, and the emitter electrode is connected through a resistor $R_6$ to the input terminal $t_2$. The transistor collector electrode is connected through a load resistor $R_5$ and further through a resistor $R_{10}$ to the positive terminal of a voltage source B (which may be 100V in this example). A capacitor $C_3$ is connected between the junction defined by the resistor $R_5$ and $R_{10}$ and the input terminal $t_2$.

The second amplifier circuit $A_2$ is connected in cascade to the amplifier circuit $A_1$ and and FET $Q_2$ as above described, connected in grounded-source configuration. Output terminals $t_3$ and $t_4$ are provided, wherein the output terminal $t_4$ is connected to the input terminal $t_2$ and also to the negative terminal of the voltage source B. If desired, a reference potential, such as ground, may be applied to the output terminal $t_4$. The gate electrode of the FET $Q_2$ is directly connected to the collector electrode of the transistor $Q_1$. As shown, the FET drain electrode is connected through a load resistor $R_{11}$ to the positive terminal of the voltage source B. The source electrode of the FET $Q_2$ is connected through a parallel circuit formed of a resistor $R_{12}$ and a capacitor $C_7$ to the output terminal $t_4$; the source electrode being further connected through a resistor $R_8$ to a junction formed between the resistors $R_2$ and $R_3$. It may be recognized that the resistors $R_2$, $R_3$, $R_8$ comprise the aforedescribed DC feedback circuit $NF_1$ of FIG. 7. The drain electrode of the FET $Q_2$ is connected through a capacitor $C_6$ to the output terminal $t_3$; and a resistor $R_{13}$ is connected as an output impedance across the output terminals $t_3$ and $t_4$.

An AC negative feedback circuit NF exhibiting predetermined frequency characteristics is provided in the feedback path from the second to the first amplifier circuits $A_2$ and $A_1$. The negative feedback circuit NF is formed of series-connected first and second parallel circuits. The first parallel circuit comprises a resistor $R_7$ and a capacitor $C_4$, and the second parallel circuit comprises a resistor $R_9$ and a capacitor $C_5$. The feedback path extends from the drain electrode of the FET $Q_2$ to the emitter electrode of the transistor $Q_1$. The values of the respective elements in the negative feedback circuit NF, i.e., resistors $R_7$ and $R_9$ and capacitors $C_4$ and $C_5$, are selected to determine the RIAA reproducing equalizing curves.

The values of the respective passive elements included in the schematically illustrated circuit may be, by way of example:

| | | | | | |
|---|---|---|---|---|---|
| $R_1$ | 100 | KΩ | $R_2$ | 100 | KΩ |
| $R_3$ | 18 | KΩ | $R_4$ | 1.5 | KΩ |
| $R_5$ | 1 | KΩ | $R_6$ | 1 | KΩ |
| $R_7$ | 620 | KΩ | $R_8$ | 220 | KΩ |
| $R_9$ | 47 | KΩ | $R_{10}$ | 100 | KΩ |
| $R_{11}$ | 12 | KΩ | $R_{12}$ | 2.2 | KΩ |
| $R_{13}$ | 100 | KΩ | | | |
| $C_1$ | 3.3 | μF | $C_2$ | 0.001 | μF |
| $C_3$ | 3.3 | μF | $C_4$ | 0.0056 | μF |
| $C_5$ | 0.0016 | μF | $C_6$ | 10 | μF |
| $C_7$ | 470 | 82 F | | | |

In the above-described cascade-connected amplifier, the first amplifier circuit $A_1$ provides a gain of approximately 60dB and the second amplifier circuit $A_2$ provides a gain of approximately 20dB or more. In order to obtain a high gain by the first amplifier circuit $A_1$, the resitance value of the load resistor $R_5$ of the transistor $Q_1$ should be increased as much as possible. In this case, the voltage supplied by the voltage source B can be high due to the high drain breakdown voltage of the FET $Q_2$. Furthermore, because of the high input impedance of the FET, the transistors $Q_1$ and $Q_2$ can be readily matched. Consequently, the resistance value of the load resistor $R_5$ of the transistor $Q_1$ can be selected to be extremely large so that the gain of the first amplifier circuit $A_1$ can be made very high. Since the output impedance of the FET $Q_2$ is low because of the low drain resistance, therefore the drain can be readily connected to a substantial load such as an RIAA equalizing element or the like.

In the first amplifier circuit $A_1$, a high gain with high S/N is obtained as described above. Even though a pick-up cartridge of relatively high output impedance on the order of several KΩis connected to the input terminals $t_1$ and $t_2$, it is possible to obtain large S/N which is substantially the same as the S/N obtained for the case wherein a very small impedance is connected across the input terminals $t_1$ and $t_2$. Further, when the negative feedback circuit is provided, the output impedance of the cascaded-amplifier is greatly lowered.

It is appreciated that when the cascade-connected transistor amplifier is used as an equalizer circuit as mentioned above with the AC negative feedback circuit, the amplifier can withstand a large load in a higher frequency range, and the open loop amplifier gain can be made large. Therefore, there is provided an amplifier which is quite effective for use in an equalizer circuit of the type described above.

While the present invention has been particularly shown and described with reference to a plurality of certain ones of the preferred embodiments thereof and with respect to a particular application, it will be obvious to those of ordinary skill in the art that this invention admits of other applications. Consequently, it is apparent that various changes and modifications in form and details may be made without departing from the spirit and scope of the invention. It is therefore intended that the appended claims be interpreted as including all such changes and modifications.

What is claimed is:

1. A cascade-connected transistor amplifier comprising a bipolar transistor including a first semiconductor region of a first conductivity type, a second semiconductor region of a second conductivity type disposed adjacent said first semiconductor region, a third semiconductor region of said first conductivity type disposed adjacent said second semiconductor region, and a potential barrier positioned within said first semiconductor region spaced from and opposite the junction defined by said first and second semiconductor regions, said potential barrier being spaced from said junction by a distance smaller than the diffusion distance of minority carriers injected into said first semiconductor region, said semiconductor regions being provided with first, second and third electrodes, respectively; a field effect transistor having triode-type dynamic characteristics; the gate electrode of said field effect transistor being connected directly to one of said first and third electrodes of said bipolar transistor; first load impedance means connected to said one electrode of said bipolar transistor; second load impedance means connected in series with the drain-source circuit of said field effect transistor; means for supplying an input signal to said second electrode of said bipolar transistor; and means for supplying an operating voltage through said first and second load impedance means to said bipolar and field effect transistors, respectively.

2. A cascade-connected transistor amplifier in accordance with claim 1 wherein said first, second and third electrodes of said bipolar transistor are emitter, base and collector electrodes, respectively.

3. A cascade-connected transistor amplifier in accordance with claim 2 wherein said bipolar transistor is connected in grounded-emitter configuration and said field effect transistor is connected in grounded-source configuration.

4. A cascade-connected amplifier in accordance with claim 3 wherein said first load impedance means is connected to the collector electrode of said bipolar transistor and said second load impedance means comprises a source load impedance connected to the source electrode of said field effect transistor and a drain load impedance connected to the drain elecrode of said field effect transistor.

5. A cascade-connected transistor amplifier in accordance with claim 4 further comprising a DC negative feedback circuit connected from the source electrode of said field effect transistor to the base electrode of said bipolar transistor.

6. A cascade-connected transistor amplifier in accordance with claim 5 further comprising an AC negative feedback circuit connected from the drain electrode of said field effect transistor to the emitter electrode of said bipolar transistor.

7. A cascade-connected transistor amplifier in accordance with claim 6 wherein said AC negative feedback circuit comprises series-connected first and second parallel circuits, each of said parallel circuits including a resistor connected in parallel with a capacitor.

8. A cascade-connected transistor amplifier in accordance with claim 6 wherein said AC negative feedback circuuit comprises an equalizing circuit for equalizing RIAA characteristics exhibited by said input signal.

9. A cascade-connected transistor amplifier in accordance with claim 1 wherein said first semiconductor region includes an additional semiconductor region of said second conductivity type disposed therein, said additional semiconductor region forming a junction with said first semiconductor region which is spaced from and opposite the junction defined by said first and second semiconductor regions by a distance smaller than the diffusion distance of said minority carriers injected into said first semiconductor region.

10. An equalizing amplifier circuit for equalizing an output signal derived from a pick-up cartridge of phonograph record player to thereby compensate for the RIAA equalizing characteristics added to said signal during a phonograph record recording operaton, comprising a bipolar transistor including a first semiconductor region of a first conductivity type, a second semiconductor region of a second conductivity type disposed adjacent said first semiconductor region, a third semiconductor region of said first conductivity type disposed adjacent said second semiconductor region, and a potential barrier positioned within said first semiconductor region spaced from and opposite the junction defined by said first and second semiconductor regions, said potential barrier having an energy higher than that of minority carriers injected into said first semiconductor region and being spaced from said junction by a distance smaller than the diffusion distance of said minority carriers, said first, second and third semiconductor regions being provided with emitter, base and collector electrodes, respectively; a field effect transistor having triode-type dynamic characteristics and including a gate electrode connected directly with said collector electrode; a collector impedance connected to said collector electrode; a drain impedance connected to said drain electrode; a source of operating potential for supplying operating voltage to said bipolar and field effect transistors, respectively, through said respective collector and drain impedances; an AC equalizing feedback circuit for defining a feedback path between said drain electrode and said base electrode, said feedback circuit exhibiting RIAA compensating characteristics; and means for supplying said signal derived from said cartridge output to said base electrode of said bipolar transistor.

* * * * *